(12) United States Patent
Hashiguchi

(10) Patent No.: US 10,594,061 B1
(45) Date of Patent: Mar. 17, 2020

(54) SOLDER COMPONENT

(71) Applicant: Japan Aviation Electronics Industry, Limited, Tokyo (JP)

(72) Inventor: Osamu Hashiguchi, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 16/505,136

(22) Filed: Jul. 8, 2019

(30) Foreign Application Priority Data

Aug. 31, 2018 (JP) ................................ 2018-162863

(51) Int. Cl.
| | | |
|---|---|---|
| *H01R 12/57* | (2011.01) | |
| *H05K 1/18* | (2006.01) | |
| *H01L 23/31* | (2006.01) | |
| *H01L 23/495* | (2006.01) | |
| *H01R 12/70* | (2011.01) | |
| *B23K 101/42* | (2006.01) | |
| *B23K 1/008* | (2006.01) | |

(52) U.S. Cl.
CPC ............ *H01R 12/57* (2013.01); *H05K 1/181* (2013.01); *B23K 1/008* (2013.01); *B23K 2101/42* (2018.08); *H01L 23/3114* (2013.01); *H01L 23/4952* (2013.01); *H01L 23/49555* (2013.01); *H01R 12/707* (2013.01); *H05K 2201/1084* (2013.01); *H05K 2201/10189* (2013.01); *H05K 2201/10628* (2013.01); *H05K 2201/10689* (2013.01); *H05K 2201/10757* (2013.01); *H05K 2201/10803* (2013.01)

(58) Field of Classification Search
CPC ...... H01R 12/57; H01R 12/707; H05K 1/181; H05K 2201/10757; H05K 2201/10189; B23K 2101/42; H01L 23/49555

USPC ........................................................ 174/257
See application file for complete search history.

(56) References Cited

U.S. PATENT DOCUMENTS

| | | | | |
|---|---|---|---|---|
| 7,445,503 B1 * | 11/2008 | Zhang | ................... | H01R 13/41 439/607.01 |
| 7,575,466 B2 * | 8/2009 | Ishizuka | .............. | H01R 13/658 439/468 |

(Continued)

FOREIGN PATENT DOCUMENTS

JP     2013254797 A     12/2013

*Primary Examiner* — Sherman Ng
(74) *Attorney, Agent, or Firm* — Muncy, Geissler, Olds & Lowe, PC

(57) ABSTRACT

A solder component includes one or more terminal members each having a bending portion bending in a direction crossing a surface of a substrate and being connected to the surface of the substrate, and four or more substrate connection portions formed at end portions of the terminal members, three substrate connection portions out of the four or more substrate connection portions each having a width narrower than a width of the bending portion of the corresponding terminal member, when the solder component is disposed on the surface of the substrate, only the three substrate connection portions being in contact with the surface of the substrate, and no matter where a contact point contacting the surface of the substrate is provided on each substrate connection portion, a mass center of the solder component being located inside a triangle determined by three contact points of the three substrate connection portions.

4 Claims, 4 Drawing Sheets

(56) References Cited

U.S. PATENT DOCUMENTS

| | | | |
|---|---|---|---|
| 8,460,034 B2* | 6/2013 | Song | H01R 13/6594 439/607.36 |
| 2006/0199430 A1* | 9/2006 | Northey | H01R 12/7035 439/566 |
| 2008/0057795 A1* | 3/2008 | Chen | H01R 13/6594 439/723 |

* cited by examiner

SOLDER COMPONENT

BACKGROUND OF THE INVENTION

The present invention relates to a solder component, particularly to a solder component to be subjected to surface-mount process on a substrate.

Surface-mount technology has been conventionally employed as a method for mounting a solder component such as an electronic component or a semiconductor component on a substrate. Surface-mount technology is a method for fixing a solder component to a substrate by disposing the solder component on the substrate surface on which a solder paste has been coated, and subsequently heating the substrate in a high-temperature furnace to melt the solder.

An example of a solder component to be mounted through the surface-mount technology is disclosed in JP2013-254797. The solder component includes a plurality of lead portions 2 drawn from a component body 1, each of the lead portions 2 has a planar portion 3 opposing a substrate that is not shown, and the planar portion 3 is provided with a projection 4 projecting toward the substrate, as illustrated in FIG. 11.

For instance, as illustrated in FIG. 12, eight lead portions 2 can be provided, and the projections 4 are arranged such that the center of mass G of the solder component is located inside a quadrilateral S1 determined by the projections 4 of the eight lead portions 2, whereby the solder component that is disposed on the substrate surface attempts to have stable attitude.

However, even though as many as eight lead portions 2 are provided, in reality, the solder component disposed on the substrate surface is supported by only the projections 4 of any three lead portions 2 surrounding the center of mass G.

In addition, since every lead portion 2 is provided with the projection 4 on the planar portion 3 thereof, variation in shape of the projections occurring in production, e.g., generation of burrs on the projections 4, decides which projections 4 of the lead portions 2 out of the projections 4 of the eight lead portions 2 come into contact with the substrate surface when the solder component is disposed on the substrate surface; it is impossible to specify which three projections 4 of the lead portions 2 would support the solder component in reality, even if every solder component is produced in the identical design.

Therefore, when the solder component is supported by three projections 4A as illustrated in FIG. 12, for example, a triangle S2 is determined by the three projections 4A which are linked to one another, and the center of mass G of the solder component is located on a hypotenuse 5 of the triangle S2. Accordingly, the solder component would become so unstable that, if the solder component receives even a small external force when being soldered, the attitude of the solder component would change and possibly cause connection failure.

SUMMARY OF THE INVENTION

The present invention has been made to overcome the above problem associated with the prior art and provide a solder component capable of establishing highly reliable connection even when the solder component is surface-mounted.

A solder component according to the present invention comprises:

one or more terminal members each of which has a bending portion bending in a direction crossing a surface of a substrate and which is connected to the surface of the substrate through a surface-mount process; and four or more substrate connection portions formed at end portions of the one or more terminal members, wherein three substrate connection portions out of the four or more substrate connection portions each have a width that is narrower than a width of the bending portion of the corresponding terminal member, and wherein, when the solder component is disposed on the surface of the substrate, only the three substrate connection portions are in contact with the surface of the substrate, and no matter where a contact point contacting the surface of the substrate is provided on each of the three substrate connection portions, a center of mass of the solder component is located inside a triangle determined by three contact points of the three substrate connection portions.

DETAILED DESCRIPTION OF THE INVENTION

Embodiments of the present invention are described below based on the appended drawings.

Embodiment 1

Figure 1:
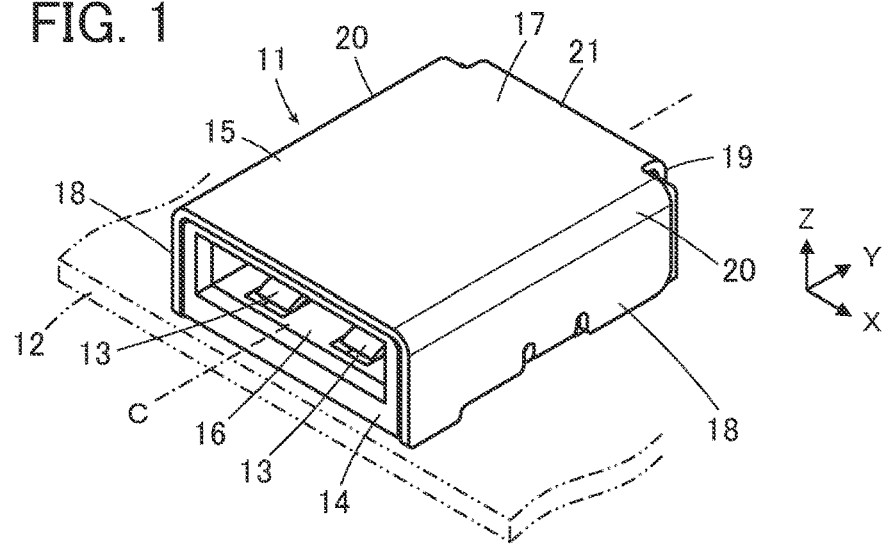
FIG. 1 is a perspective view of a solder component according to Embodiment 1 of the present invention when viewed from an obliquely upper position.

FIG. 1 illustrates a solder component 11 according to Embodiment 1. The solder component 11 is surface-mounted on a substrate 12 and is to be fitted to a counter connector (not shown) along a fitting axis C.

The solder component 11 includes a pair of contacts (terminal members) 13, an insulator 14 supporting the pair of contacts 13 and a metal shell 15 covering the peripheral portion of the insulator 14. In the insulator 14, formed is a recessed, counter connector accommodating portion 16 opening toward the front direction of the solder component 11, and front end portions of the pair of contacts 13 are exposed inside the counter connector accommodating portion 16.

For convenience, the direction from front to back of the solder component 11 along the fitting axis C is called "+Y direction," the direction in parallel with a surface of the substrate 12 and perpendicular to the Y direction "X direction," and the direction orthogonal to the surface of the substrate 12 and advancing from the substrate 12 to the solder component 11 "+Z direction."

The metal shell 15 is provided to shield the pair of contacts 13 and includes: an upper surface portion 17 covering an upper surface on the +Z direction side of the insulator 14; a pair of side surface portions (terminal members) 18 covering a side surface on the +X direction side as well as a side surface on the −X direction side of the insulator 14; and a back surface portion (terminal member) 19 covering a back surface on the +Y direction side of the insulator 14.

At a pair of bending portions 20 independently positioned at the +X directional end of the upper surface portion 17 and at the −X directional end of the upper surface portion 17, the pair of side surface portions 18 each bend at a right angle with respect to the upper surface portion 17 and extend along a YZ plane in the −Z direction. At a bending portion 21 positioned at the +Y directional end of the upper surface portion 17, the back surface portion 19 bends at a right angle with respect to the upper surface 17 and extends along an XZ plane in the −Z direction. In other words, the pair of side surface portions 18 and the back surface portion 19 bend in the direction orthogonal to the surface of the substrate 12.

Figure 2:
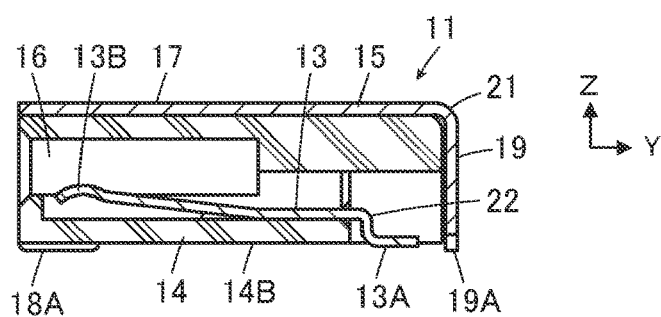
FIG. 2 is a cross-sectional side view showing the solder component according to Embodiment 1.

As illustrated in FIG. 2, each of the contacts 13 extends nearly across the full length of the solder component 11 in the Y direction; an end portion (+Y directional end) of the contact 13 bends at a bending portion 22 in the −Z direction, then bends in the +Y direction, and is exposed from a bottom surface 14B facing the −Z direction of the insulator 14, thereby forming a substrate connection portion 13A. In the meantime, the −Y directional end of the contact 13 is exposed inside the counter connector accommodating portion 16, forming a contact portion 13B that comes into contact with a contact of the counter connector (not shown) in a fitting process.

Figure 3:
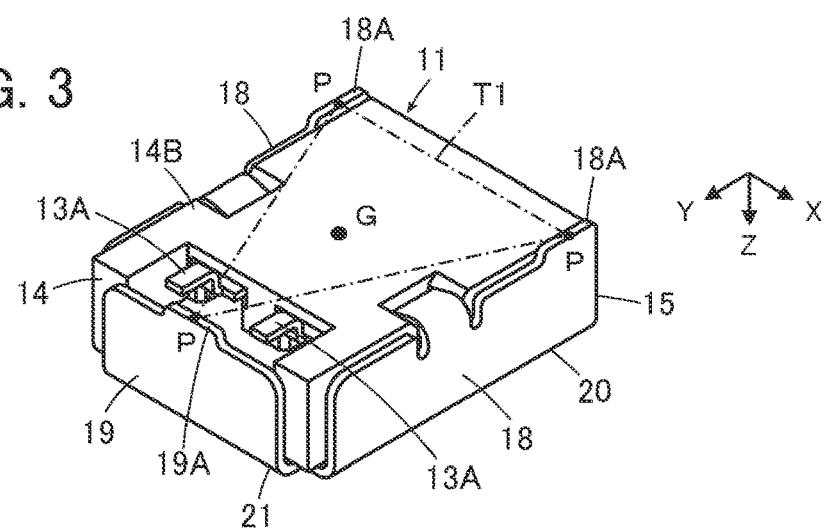
FIG. 3 is a perspective view of the solder component according to Embodiment 1 when viewed from an obliquely lower position.

As illustrated in FIG. 3, the metal shell 15 has a pair of substrate connection portions 18A independently formed at end portions (−Z directional ends) of the pair of side surface portions 18 that bend at the pair of bending portions 20, and a substrate connection portion 19A formed at an end portion (−Z directional end) of the back surface portion 19 that bends at the bending portion 21.

The pair of substrate connection portions 18A each have a notched shape in which the −Z directional end of the corresponding side surface portion 18 is notched, and the substrate connection portion 19A has a notched shape in which the −Z directional end of the back surface portion 19 is notched.

The pair of side surface portions 18 of the metal shell 15 constitute two terminal members that have the pair of bending portions 20 and that will be connected to the surface of the substrate 12 through surface-mount process, the back surface portion 19 of the metal shell 15 constitutes a single terminal member that has the bending portion 21 and that will be connected to the surface of the substrate 12 through surface-mount process, and the pair of contacts 13 constitute two terminal members that separately have the bending portions 22 and that will be connected to the surface of the substrate 12 through surface-mount process; the solder component 11 has five terminal members in total.

In addition, the solder component 11 has a total of five substrate connection portions, including the two substrate connection portions 18A formed at the side surface portions 18 of the metal shell 15, the single substrate connection portion 19A formed at the back surface portion 19 of the metal shell 15 and the two substrate connection portions 13A formed at the pair of contacts 13.

That is, each of the five terminal members constituted of the pair of side surface portions 18 of the metal shell 15, the back surface portion 19 of the metal shell 15 and the pair of contacts 13 is provided with a single substrate connection portion at the end portion thereof.

Figure 4:
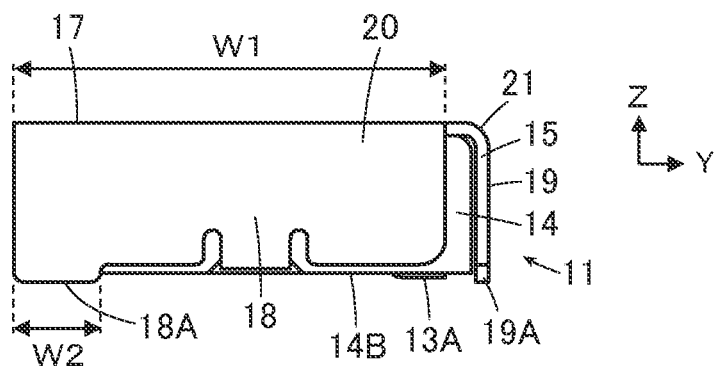
FIG. 4 is a side view showing the solder component according to Embodiment 1.

As illustrated in FIG. 4, the bending portion 20 positioned at the +Z directional end of the side surface portion 18 of the metal shell 15 has a width W1 along the Y direction, while the substrate connection portion 18A formed at the −Z directional end of the side surface portion 18 has a width W2 along the Y direction, which width W2 is narrower than the width W1 of the bending portion 20.

Figure 5:
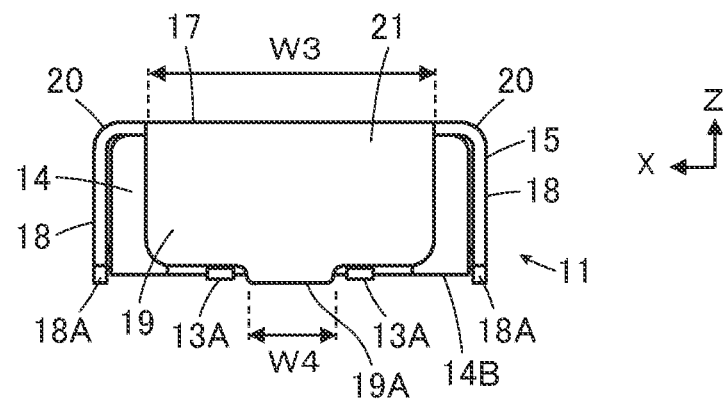
FIG. 5 is a back view showing the solder component according to Embodiment 1.

As illustrated in FIG. 5, the bending portion 21 positioned at the +Z directional end of the back surface portion 19 of the metal shell 15 has a width W3 along the X direction, while the substrate connection portion 19A formed at the −Z directional end of the back surface portion 19 has a width W4 along the X direction, which width W4 is narrower than the width W3 of the bending portion 21.

As illustrated in FIGS. 4 and 5, the substrate connection portions 13A of the contacts 13 slightly project in the −Z direction below the bottom surface 14B of the insulator 14, and the substrate connection portions 18A of the side surface portions 18 and the substrate connection portion 19A of the back surface portion 19 of the metal shell 15 project farther in the −Z direction than the substrate connection portions 13A of the contacts 13. In other words, the substrate connection portions 18A of the side surface portions 18 and the substrate connection portion 19A of the back surface portion 19 of the metal shell 15 are each designed to have a larger amount of projection with reference to the bottom surface 14B of the insulator 14 than an amount of projection of the substrate connection portions 13A of the contacts 13.

Accordingly, when the solder component 11 is disposed on a planar surface of the substrate 12 as shown in FIG. 1, out of the total five substrate connection portions, the pair of substrate connection portions 13A formed at the pair of contacts 13 are positioned to be in non-contact with the surface of the substrate 12, having a slight interval in the +Z direction from the surface of the substrate 12. Therefore, only the specified three substrate connection portions constituted of the pair of substrate connection portions 18A formed at the pair of side surface portions 18 and the substrate connection portion 19A formed at the back surface portion 19 of the metal shell 15 are in contact with the surface of the substrate 12.

Further, the solder component 11 is configured such that, when the solder component 11 is disposed on the surface of the substrate 12, no matter where a contact point P contacting the surface of the substrate 12 is provided on each of the substrate connection portion 18A of the side surface portion 18 on the +X direction side having the width W2 along the Y direction, the substrate connection portion 18A of the side surface portion 18 on the −X direction side having the width W2 along the Y direction, and the substrate connection portion 19A of the back surface portion 19 having the width W4 along the X direction, as illustrated in FIG. 3, the center of mass G of the solder component 11 is located inside a triangle T1 determined by the three contact points P. Here, "being located inside the triangle T1" means that the center of mass G is located in the inner side from the edge portions of the triangle T1 and not located on any side or vertex of the triangle T1.

As above, even when only the three substrate connection portions constituted of the pair of substrate connection portions 18A formed on the pair of side surface portions 18 and the substrate connection portion 19A formed on the back surface portion 19 of the metal shell 15 come into contact with the surface of the substrate 12, and no matter where the contact point P is provided on each of the three substrate connection portions, the center of mass G of the solder component 11 is located inside the triangle T1 determined by the three contact points P; therefore, the solder component 11 becomes stable, and even if the solder component 11 receives a small external force, the attitude thereof does not change.

Accordingly, when the solder component 11 is soldered by a surface-mount method, the attitude of the solder component 11 remains unchanged so that connection failure is prevented, whereby the highly reliable connection can be established.

When the solder component 11 is surface-mounted on the substrate 12, the three substrate connection portions constituted of the pair of substrate connection portions 18A and the substrate connection portion 19A of the metal shell 15 are soldered to connection pads for the shell that are formed on the surface of the substrate 12 but are not shown in the figures, while the substrate connection portions 13A of the pair of contacts 13 are soldered to connection pads for the contacts that are formed on the surface of the substrate 12 but are not shown in the figures.

Each of the pair of substrate connection portions 18A of the metal shell 15 is formed at the end portion (−Z directional end) of the associated side surface portion 18 having the bending portion 20, the substrate connection portion 19A of the metal shell 15 is formed at the end portion (−Z directional end) of the back surface portion 19 having the bending portion 21, and each of the substrate connection portions 13A of the pair of contacts 13 is formed on the end portion (+Y directional end) of the associated contact 13 having the bending portion 22; therefore, the bending portions 20, 21 and 22 can prevent the terminal members including the substrate connection portions 18A, 19A and 13A from deforming due to an exterior force.

In addition, since the three substrate connection portions 18A, 18A and 19A are specified to come into contact with the surface of the substrate 12 when the solder component 11 is disposed on the planar surface of the substrate 12, even if variation in shape occurs in production, e.g., burrs on any of the substrate connection portions generate, the solder component 11 can be readily designed to have the center of mass G located inside the triangle T1 determined by the contact points P of the specified three substrate connection portions 18A, 18A and 19A.

Moreover, when the solder component 11 is disposed on the planar surface of the substrate 12, while the three substrate connection portions 18A, 18A and 19A that come into contact with the surface of the substrate 12 each have a width that is narrower than the width of the corresponding bending portion 20 or 21, the side surface portions 18 and the back surface portion 19 constituting the terminal members are not designed to make their entire widths narrow but to have narrow widths only at their −Z directional ends. Accordingly, while the strength of the side surface portions 18 and the back surface portion 19 is maintained, three substrate connection portions can be specified for supporting the solder component 11.

Moreover, the number of the substrate connection portions is not limited to five. Even when the solder component has four or more substrate connection portions that are formed at one or more terminal members, and three specified substrate connection portions out of the four or more substrate connection portions have narrower widths than the widths of the corresponding bending portions, only the three specified substrate portions come into contact with the surface of the substrate 12 when the solder component is disposed on the surface of the substrate 12; no matter where the contact point contacting with the surface of the substrate 12 is provided on each of the three specified substrate connection portions, it is sufficient that the center of mass of the solder component is located inside the triangle determined by three contact points of the three specified substrate connection portions.

While the pair of side surface portions 18 and the back surface portion 19 of the metal shell 15 constituting the terminal members respectively bend at the bending portions 20 and the bending portion 21 in directions perpendicular to the surface of the substrate 12, the present invention is not limited thereto, and it is sufficient that the side surface portions 18 and the back surface portion 19 bend at least in directions crossing the surface of the substrate 12.

Embodiment 2

In Embodiment 1 described above, the five terminal members constituted of the pair of side surface portions 18 of the metal shell 15, the back surface portion 19 of the metal shell 15 and the pair of contacts 13 are each provided at their end portions with a single substrate connection portion, but the present invention is not limited thereto.

Figure 6:
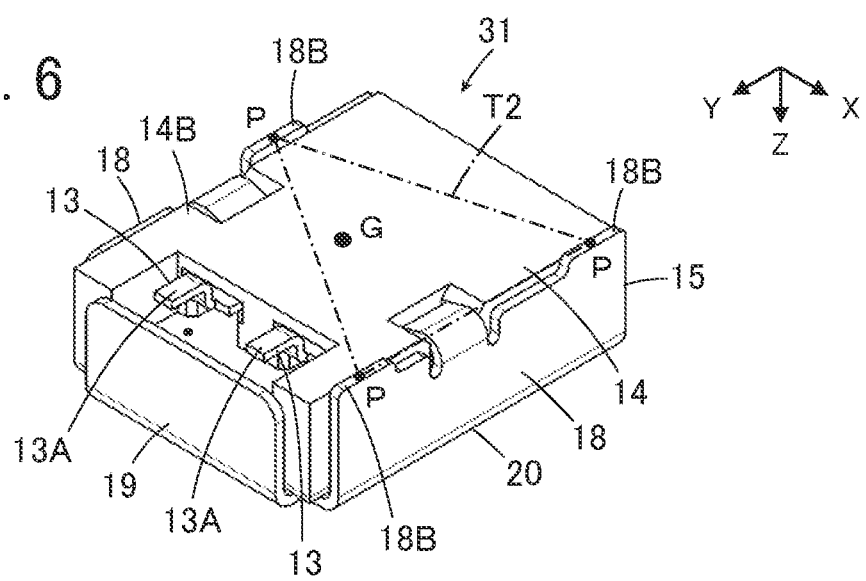
FIG. 6 is a perspective view of a solder component according to Embodiment 2 when viewed from an obliquely lower position.

FIG. 6 illustrates a solder component 31 according to Embodiment 2. The solder component 31 is configured such that positions of the three substrate connection portions 18A, 18A and 19A of the metal shell 15 in the solder component 11 according to Embodiment 1 are changed to have three new substrate connection portions 18B. In the solder component 31, other constitutional parts than the substrate connection portions 18B are the same as those in the solder component 11 according to Embodiment 1 and are assigned with the same numbers as those of the constitutional parts of the solder component 11.

In particular, the solder component 31 includes the pair of contacts 13, the insulator 14 supporting the pair of contacts 13 and the metal shell 15 covering the peripheral portion of the insulator 14. Of the pair of side surface portions 18 of the metal shell 15, the side surface portion 18 on the +X direction side has a pair of substrate connection portions 18B separately formed at opposite ends along the Y direction and at the −Z directional end of the associated side surface portion 18, while the other side surface portion 18 on the −X direction side has one substrate connection portion 18B formed at the −Z directional end of the associated side surface portion 18. The substrate connection portions 18B each have a notched shape in which the −Z directional end of the associated side surface portion 18 is notched and have a width along the Y direction that is narrower than the width of the bending portion 20.

The solder component 31 has a total of five substrate connection portions, including the three substrate connection portions 18B formed at the pair of side surface portions 18 of the metal shell 15 and the two substrate connection portions 13A formed at the pair of contacts 13.

The three substrate connection portions 18B of the metal shell 15 have a larger amount of projection in the −Z direction with reference to the bottom surface 14B of the insulator 14 than the amount of projection of the substrate connection portions 13A of the contacts 13. Accordingly, when the solder component 31 is disposed on the surface of the substrate 12, out of the total five substrate connection portions, only the three substrate connection portions 18B of the metal shell 15 come into contact with the surface of the substrate 12.

Further, the solder component 31 is configured such that, when the solder component 31 is disposed on the surface of the substrate 12, no matter where the contact point P is provided on each of the three substrate connection portions 18B, as illustrated in FIG. 6, the center of mass G of the solder component 31 is located inside a triangle T2 that is determined by the three contact points P.

Accordingly, the solder component 31 becomes stable, and even if the solder component 31 receives a small external force, the attitude thereof does not change.

When the solder component 31 is configured such that the two substrate connection portions 18B are formed at the end portion of one side surface portion 18 (terminal member), and only the three substrate connection portions 18B including the foregoing two substrate connection portions 18B are in contact with the surface of the substrate 12 as described above, as with the solder component 11 according to Embodiment 1, when the solder component 31 is soldered by the surface-mount method, the attitude of the solder component 31 remains unchanged so that connection failure is prevented, whereby the highly reliable connection can be established.

In addition, even if three substrate connection portions are formed at an end portion of one terminal member, and only the three substrate connection portions are in contact with the surface of the substrate 12, when the solder component is soldered by the surface-mount method, the attitude of this solder component remains unchanged so that connection failure is prevented, whereby the highly reliable connection can be established.

Embodiment 3

In Embodiment 1 described above, the pair of substrate connection portions 18A of the metal shell 15 are separately formed of the end portions of the side surface portions 18 extending in the −Z direction, and the substrate connection portion 19A of the metal shell 15 is formed of the end portion of the back surface portion 19 extending in the −Z direction, but the present invention is not limited thereto.

Figure 7:
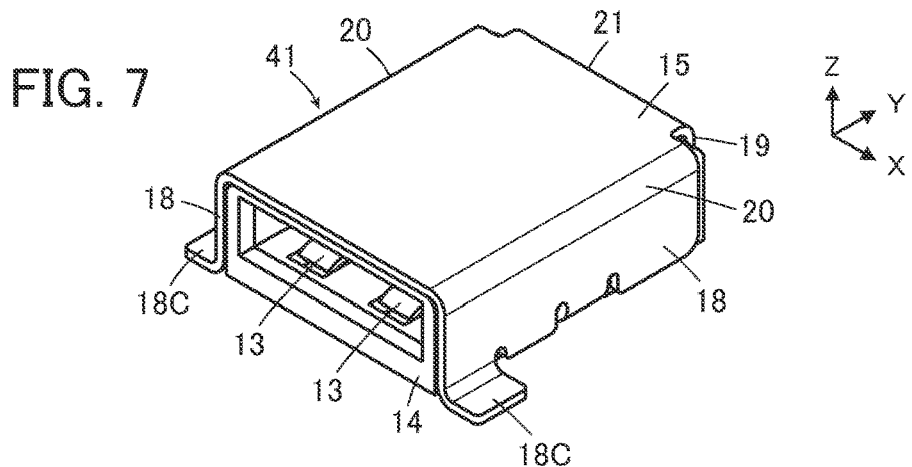
FIG. 7 is a perspective view of a solder component according to Embodiment 3 when viewed from an obliquely upper position.
Figure 8:
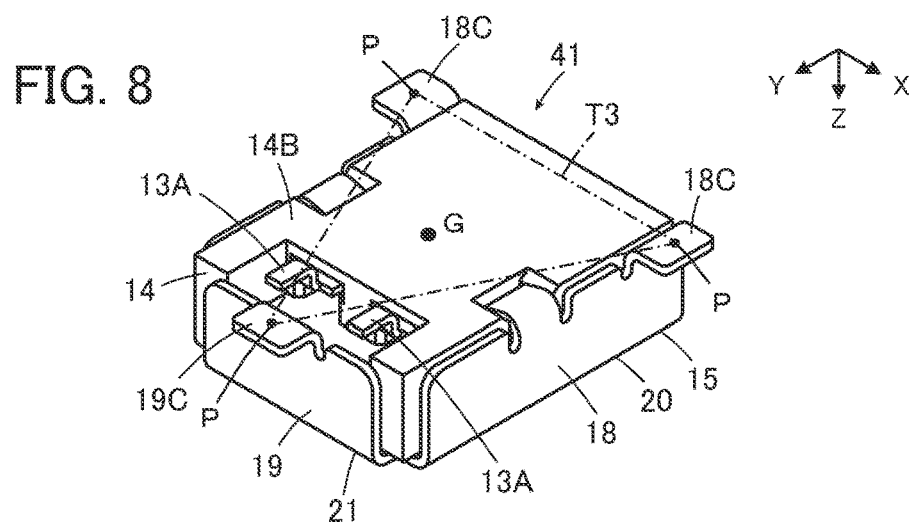
FIG. 8 is a perspective view of the solder component according to Embodiment 3 when viewed from an obliquely lower position.

FIGS. 7 and 8 illustrate a solder component 41 according to Embodiment 3. The solder component 41 is configured such that the three substrate connection portions 18A, 18A and 19A of the metal shell 15 in the solder component 11 according to Embodiment 1 are replaced with three substrate connection portions 18C, 18C and 19C whose end portions are bent to directions parallel with the XY plane. In the solder component 41, other constitutional parts than the substrate connection portions 18C, 18C and 19C are same as those in the solder component 11 according to Embodiment 1 and are assigned with the same numbers as those of the constitutional parts of the solder component 11.

In particular, the solder component 41 includes the pair of contacts 13, the insulator 14 supporting the pair of contacts 13 and the metal shell 15 covering the peripheral portion of the insulator 14. The −Z directional ends of the pair of side surface portions 18 of the metal shell 15 are bent to directions parallel with the XY plane to form the substrate connection portions 18C, while the −Z directional end of the back surface portion 19 is bent to a direction parallel with the XY plane to form the substrate connection portion 19C.

Each of the pair of substrate connection portions 18C formed at the pair of side surface portions 18 of the metal shell 15 has a notched shape in which the −Z directional end of the associated side surface portion 18 is notched and has a width along the Y direction that is narrower than the width of the bending portion 20. In addition, the substrate connection portion 19C formed at the back surface portion 19 of the metal shell 15 has a notched shape in which the −Z directional end of the back surface portion 19 is notched and has a width along the X direction that is narrower than the width of the bending portion 21.

The solder component 41 includes a total of five substrate connection portions, including the two substrate connection portions 18C formed at the pair of side surface portions 18 of the metal shell 15, the single substrate connection portion 19C formed at the back surface portion 19 of the metal shell 15 and the two substrate connection portions 13A formed at the pair of contacts 13.

The three substrate connection portions 18C, 18C and 19C of the metal shell 15 have a larger amount of projection in the −Z direction with reference to the bottom surface 14B of the insulator 14 than the amount of projection of the substrate connection portions 13A of the contacts 13. Accordingly, when the solder component 41 is disposed on the surface of the substrate 12, out of the total five substrate connection portions, only the three substrate connection portions 18C, 18C and 19C of the metal shell 15 come into contact with the surface of the substrate 12.

Further, the solder component 41 is configured such that, when the solder component 41 is disposed on the surface of the substrate 12, no matter where the contact point P is provided on each of the three substrate connection portions 18C, 18C and 19C, as illustrated in FIG. 8, the center of mass G of the solder component 41 is located inside a triangle T3 that is determined by the three contact points P.

Accordingly, as with the solder component 11 according to Embodiment 1, the solder component 41 becomes stable, and when the solder component 41 is soldered by the surface-mount method, the attitude of the solder component 41 remains unchanged so that connection failure is prevented, whereby the highly reliable connection can be established.

Meanwhile, the solder component 31 according to Embodiment 2 can be also constituted by using three substrate connection portions whose end portions are bent to directions parallel with the XY plane in place of the three substrate connection portions 18B of the metal shell 15 and can obtain the same effect as above.

Embodiment 4

In the foregoing Embodiments 1 to 3, the solder components 11, 31 and 41 are described as a connector, but the present invention is not limited thereto.

Figure 9:
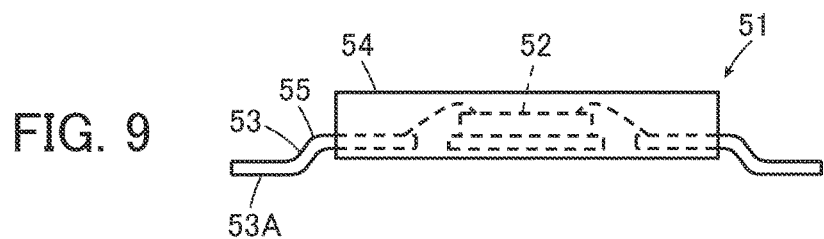
FIG. 9 is a front view showing a solder component according to Embodiment 4.

FIG. 9 illustrates a solder component 51 according to Embodiment 4. The solder component 51 is a semiconductor component to which the present invention is applied.

The solder component 51 includes a semiconductor chip 52, four or more lead terminals 53 (terminal members) arranged around the semiconductor chip 52 and electrically connected to the semiconductor chip 52, and a package 54 covering the semiconductor chip 52 and a part of each of the lead terminals 53.

Each of the lead terminals 53 bends at a bending portion 55 and includes at an end portion thereof a substrate connection portion 53A projecting below a lower surface of the package 54. More specifically, at end portions of the four or more lead terminals 53, as many substrate connection portions 53A as the number of four or more lead terminals 53 are formed.

Figure 10:
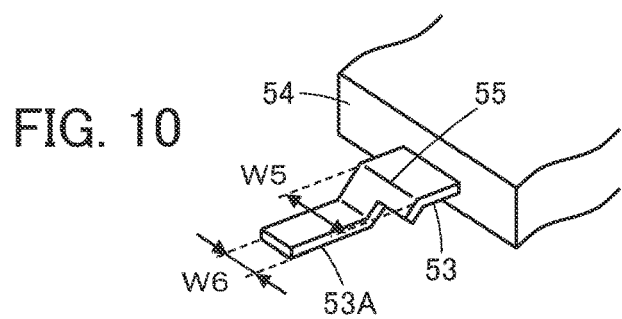
FIG. 10 is a partial perspective view showing a terminal member of the solder component according to Embodiment 4.
Figure 11:
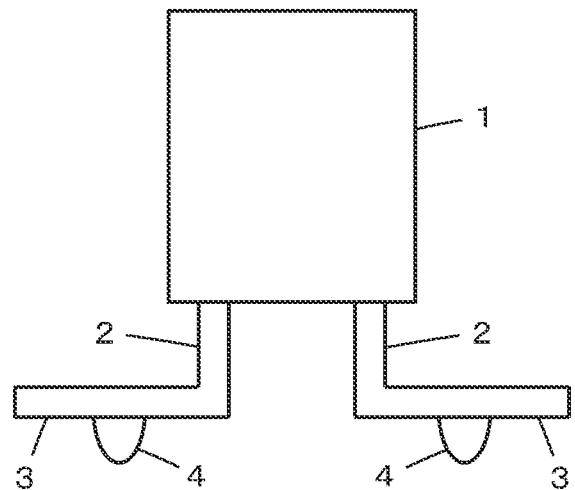
FIG. 11 is a front view showing a conventional solder component.
Figure 12:
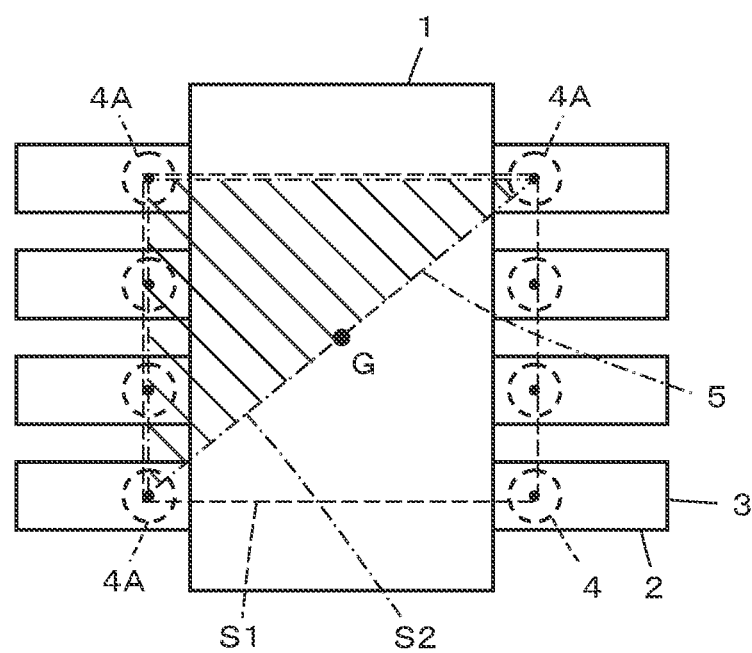
FIG. 12 is a plan view showing the conventional solder component.

Out of the four or more lead terminals 53, at least three lead terminals 53 are notched at end portions thereof as illustrated in FIG. 10, whereby the at least three substrate connection portions 53A each have a width W6 that is narrower than a width W5 of the bending portion 55.

In addition, out of the at least three substrate connection portions 53A each having the width W6, three specified substrate connection portions 53A are each designed to have a larger amount of projection projecting downward below the package 54 than that of other substrate connection portions 53A; when the solder component 51 is disposed on a planar surface of a substrate, only the three specified substrate connection portions 53A are in contact with the surface of the substrate.

Moreover, when the solder component 51 is disposed on the surface of the substrate, no matter where the contact point P is provided on each of the three specified substrate connection portions 53A, the center of mass G of the solder component 51 is located inside a triangle determined by the three contact points P.

Accordingly, the solder component 51 becomes stable, and when the solder component 51 is soldered by the surface-mount method, the attitude of the solder component 51 remains unchanged so that connection failure is prevented, whereby the highly reliable connection can be established.

As described above, also when the present invention is applied to a semiconductor component, the solder component 51 capable of establishing highly reliable connection through surface-mount can be realized.

In addition, the present invention can be applied not only to a connector and a semiconductor component but also to various solder components to be surface-mounted on a substrate.

It should be noted that while the present invention is applied to a terminal member for surface-mount in order to solve the problem associated with a terminal member for surface-mount of a solder component, the present invention does not exclude a case where the solder component includes a terminal member for through-hole mount in addition to a terminal member for surface-mount.

What is claimed is:

1. A solder component to be subjected to surface-mount process on a substrate, the solder component comprising:
   one or more terminal members each of which has a bending portion bending in a direction crossing a surface of the substrate and which is connected to the surface of the substrate through the surface-mount process; and
   four or more substrate connection portions formed at end portions of the one or more terminal members,
   wherein three substrate connection portions out of the four or more substrate connection portions each have a width that is narrower than a width of the bending portion of the corresponding terminal member, and
   wherein, when the solder component is disposed on the surface of the substrate, only the three substrate connection portions are in contact with the surface of the substrate, and no matter where a contact point contacting the surface of the substrate is provided on each of the three substrate connection portions, a center of mass of the solder component is located inside a triangle determined by three contact points of the three substrate connection portions.

2. The solder component according to claim 1, wherein each of the three substrate connection portions has a notched shape in which an end portion of the corresponding terminal member is notched.

3. The solder component according to claim 1, wherein one of the substrate connection portions is formed at an end portion of each of the one or more terminal members.

4. The solder component according to claim 1, wherein two or more substrate connection portions are formed at an end portion of at least one terminal member out of the one or more terminal members.

* * * * *